(12) United States Patent
Wiesmann (10) Patent No.: US 10,833,234 B2
(45) Date of Patent: Nov. 10, 2020

(54) OPTOELECTRONIC SEMICONDUCTOR COMPONENT (71) Applicant: OSRAM OLED GmbH, Regensburg (DE)

(72) Inventor: Christopher Wiesmann, Barbing (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/480,966

(22) PCT Filed: Mar. 5, 2018

(86) PCT No.: PCT/EP2018/055356
§ 371 (c)(1),
(2) Date: Jul. 25, 2019

(87) PCT Pub. No.: WO2018/162420
PCT Pub. Date: Sep. 13, 2018

(65) Prior Publication Data
US 2020/0006609 A1    Jan. 2, 2020

(30) Foreign Application Priority Data
Mar. 8, 2017 (DE) .................. 10 2017 104 871

(51) Int. Cl.
*H01L 33/60* (2010.01)
*H01L 33/20* (2010.01)
(Continued)

(52) U.S. Cl.
CPC .............. *H01L 33/60* (2013.01); *H01L 33/20* (2013.01); *H01L 33/46* (2013.01); *H01L 33/486* (2013.01);
(Continued)

(58) Field of Classification Search
CPC ......... H01L 33/20; H01L 33/24; H01L 33/46; H01L 33/58; H01L 33/60; H01L 2933/0091
See application file for complete search history.

(56) References Cited

U.S. PATENT DOCUMENTS

| 2013/0228744 A1* | 9/2013 | Kazama | ................. H01L 33/14 257/13 |
| 2014/0034980 A1* | 2/2014 | Kazama | ................. H01L 33/22 257/98 |

(Continued)

FOREIGN PATENT DOCUMENTS

| DE | 10 2011 085 275 A1 | 1/2013 |
| DE | 10 2012 214 219 A1 | 2/2014 |

(Continued)

*Primary Examiner* — Stephen W Smoot
(74) *Attorney, Agent, or Firm* — DLA Piper LLP (US)

(57) ABSTRACT

An optoelectronic semiconductor component includes a semiconductor layer sequence that generates radiation, the semiconductor layer sequence has an emission side and a rear side opposite said emission side, a mirror for the generated radiation on the rear side, a carrier that is transmissive to the radiation generated, on the emission side, and a reflector housing on side surfaces of the carrier, the reflector housing is impermeable to the generated radiation and configured for diffuse reflection of generated radiation and includes a radiation exit opening, wherein at least one of a width of an opening in the reflector housing and an area of the radiation exit opening decrease(s) in a direction away from the emission side, and a maximum emission of the generated radiation takes place in an emission angle range of 30° to 60°, relative to a perpendicular to the emission side.

15 Claims, 5 Drawing Sheets

(51) Int. Cl.
*H01L 33/48* (2010.01)
*H01L 33/58* (2010.01)
*H01L 33/46* (2010.01)

(52) U.S. Cl.
CPC ...... *H01L 33/58* (2013.01); *H01L 2933/0091* (2013.01)

(56) References Cited

U.S. PATENT DOCUMENTS

| | | |
|---|---|---|
| 2014/0168972 A1 | 6/2014 | Ebner |
| 2014/0175487 A1 | 6/2014 | Zhang |
| 2014/0226345 A1 | 8/2014 | Song et al. |
| 2015/0008392 A1* | 1/2015 | Bonar ................ H01L 33/38 257/13 |
| 2015/0311404 A1 | 10/2015 | Binder et al. |
| 2016/0072022 A1 | 3/2016 | Lowes et al. |
| 2016/0149104 A1 | 5/2016 | Bergmann et al. |
| 2017/0301835 A1 | 10/2017 | Singer et al. |
| 2017/0309678 A1* | 10/2017 | Yang .................. H01L 33/44 |
| 2018/0226543 A1* | 8/2018 | Masui ................ H01L 33/505 |
| 2018/0272605 A1* | 9/2018 | Gmeinwieser ........ H01L 27/156 |

FOREIGN PATENT DOCUMENTS

| | | |
|---|---|---|
| EP | 3 054 492 A2 | 8/2016 |
| JP | 2015-26753 A | 2/2015 |
| WO | 2010/044023 A1 | 4/2010 |
| WO | 2017/023502 A1 | 2/2017 |

* cited by examiner

OPTOELECTRONIC SEMICONDUCTOR COMPONENT

TECHNICAL FIELD

This disclosure relates to an optoelectronic semiconductor component.

BACKGROUND

There is a need to provide an optoelectronic semiconductor component having a low overall height and which efficiently emits a high radiation proportion at large emission angles.

SUMMARY

I provide an optoelectronic semiconductor component including a semiconductor layer sequence that generates radiation, the semiconductor layer sequence has an emission side and a rear side opposite said emission side, a mirror for the generated radiation on the rear side, a carrier that is transmissive to the radiation generated, on the emission side, and a reflector housing directly on side surfaces of the carrier, the reflector housing is impermeable to the generated radiation and configured for diffuse reflection of generated radiation and includes a radiation exit opening, wherein at least one of a width of an opening in the reflector housing and an area of the radiation exit opening decrease(s) in a direction away from the emission side, and a maximum emission of the generated radiation takes place in an emission angle range of 30° to 60°, relative to a perpendicular to the emission side.

LIST OF REFERENCE SIGNS

1 optoelectronic semiconductor component
2 semiconductor layer sequence
20 emission side
23 rear side
3 mirror
4 carrier
45 side surface
5 reflector housing
50 radiation exit opening
54 inner side
55 kink
6 connection platform
62 contact layer
7 lens
a angle inner side—emission side
b emission angle
B width of the emission side
H height of the reflector housing
P luminous flux in arbitrary units (a.u.)
P* normalized luminous flux at b=0°
W width of the radiation exit opening

DETAILED DESCRIPTION

My optoelectronic semiconductor component may have a semiconductor layer sequence. The semiconductor layer sequence may be configured to generate radiation, in particular to generate visible light such as blue light or such as white light. The optoelectronic semiconductor component is preferably a light-emitting diode, LED for short.

The semiconductor layer sequence may have an emission side and a rear side lying opposite said emission side. The radiation generated in the semiconductor layer sequence leaves the latter via the emission side. Preferably, no radiation or no significant radiation proportion exits at the rear side. It is possible that just as little radiation is emitted at side surfaces of the semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or as $Al_nGa_mIn_{1-n-m}As_kP_{1-k}$, wherein each $0 \leq n \leq 1$, $0 \leq m \leq 1$ and $n+m \leq 1$ as well as $0 \leq k < 1$. Preferably, the following applies to at least one layer or for all layers of the semiconductor layer sequence: $0 < n \leq 0.8$, $0.4 \leq m < 1$ and $n+m \leq 0.95$ as well as $0 < k \leq 0.5$. The semiconductor layer sequence can comprise dopants and additional components. For the sake of simplicity, however, only the essential components of the crystal lattice of the semiconductor layer sequence are mentioned, that is, Al, As, Ga, In, N or P, even if they can be partially replaced and/or supplemented by small quantities of further substances. The semiconductor layer sequence is preferably based on AlInGaN.

The semiconductor component may comprise a mirror. The mirror is designed to reflect the generated radiation. The mirror can be a metal mirror, a Bragg mirror or a combination mirror. In the example of a combination mirror, a metal layer is present, which in the direction towards the semiconductor layer sequence is at least partially covered with a preferably dielectric material having a low refractive index serving as a total-reflective layer. The mirror may be located on the rear side of the semiconductor layer sequence. The mirror is preferably configured to energize and/or electrically contact the semiconductor layer sequence.

The semiconductor component may comprise a reflector housing. The reflector housing may be impermeable to the generated radiation. Furthermore, the reflector housing may be designed for diffuse reflection of the generated radiation. In particular, surfaces of the reflector housing facing the semiconductor layer sequence have a Lambertian reflection characteristic. The reflector housing preferably appears white. The reflector housing is preferably a casting body, for instance produced by transfer molding or injection molding or dispensing.

The reflector housing may be attached at least or exclusively to side surfaces of the carrier. The reflector housing can be applied immediate and directly to the side surfaces. Furthermore, it is possible for the side surfaces to be covered only partially or completely by the reflector housing.

The reflector housing may have a radiation exit opening. The radiation exit opening lies opposite the emission side. The generated radiation emerges from the semiconductor component and/or out of the reflector housing at the radiation exit opening, in particular exclusively at the radiation exit opening.

A width of the reflector housing and/or a surface area of the radiation exit opening may decrease in the direction away from the emission side. This does not necessarily exclude that the width can also increase in short sections, for example, due to a roughening of the side surfaces. On average, however, the width decreases in the direction away from the emission side. The decrease in width can also be monotonically or strictly monotonically. Regions in which the width increases briefly in the direction away from the emission side preferably have an extent of at most 5 µm or 3 µm and/or of at most 2% or 1% of a height of the reflector housing. The width relates in particular to an opening formed in the reflector housing and/or to a profile of inner sides of the reflector housing and/or to a profile of side surfaces of the carrier.

The optoelectronic semiconductor component may comprise a semiconductor layer sequence that generates radiation, wherein the semiconductor layer sequence has an emission side and a rear side lying opposite the latter. A mirror for the generated radiation is located on the rear side. A carrier transmissive to the radiation generated is mounted on the emission side. A reflector housing impermeable to the radiation is located on side surfaces of the carrier and designed for diffuse reflection of the generated radiation and has a radiation exit opening opposite the emission side. A width of the reflector housing and/or a surface area of the radiation exit opening decreases in the direction away from the emission side and thus in the direction towards the radiation exit opening.

For direct backlighting of, for example, liquid crystal displays, light sources having a so-called batwing emission are helpful. That is, an intensity maximum does not lie at 0° on the optical axis as of a conventional LED, but at larger angles, for example, 30° to 80°. As a result, at a given distance from the light source to the liquid crystal mask, a number of semiconductor components to be installed can be reduced since a distance between adjacent semiconductor components can be increased. Such a batwing emission can be realized with the semiconductor component described here.

In addition, the highest possible luminance of the light source is necessary for many applications such as projection applications or front headlights. Regions of high luminance can be efficiently imaged with downstream optical elements, for example. With the semiconductor component described here, the luminance from a given light-emitting surface, that is, from the emission side, can be increased.

By virtue of the interaction of the semiconductor layer sequence with the mirror and the reflector housing and the carrier, an LED can be efficiently realized that emits at a main side opposite to a mounting side and has an increased luminance and has a batwing-like emission characteristic. In particular, sapphire flip-chips, SFCs for short, without phosphor and with inclined side flanks are used, and subsequently preferably cast around, for example, with a silicone that contains titanium dioxide particles to form the reflector housing.

The carrier may be shaped symmetrically when viewed in cross section. An axis of symmetry is preferably an optical axis of the emission side. For example, the carrier is formed as a symmetrical trapezium.

The carrier may be a growth substrate of the semiconductor layer sequence. In particular, the carrier is then a sapphire substrate and the semiconductor layer sequence is based on AlInGaN. It is possible for the carrier to have a structuring to improve the coupling of light into the carrier on a light entrance side on which the semiconductor layer sequence can be grown onto. In a sapphire substrate, such a carrier is also referred to as patterned sapphire substrates, PSS for short.

The carrier may terminate flush with the reflector housing in the direction away from the emission side. That is, the carrier and the reflector housing do not project from each other. Alternatively, it is possible for the carrier to project from the reflector housing or vice versa.

The semiconductor layer sequence may be electrically contacted by the mirror. In particular, the mirror has a plurality of partial layers or wiring planes, via which both an n-side and a p-side of the semiconductor layer sequence can electrically connect.

Viewed in cross section, a quotient of a width of the radiation exit opening and a width of the emission side may be at least 0.5 or 0.6. Alternatively or additionally, this quotient is at most 0.9 or 0.8 or 0.7.

A quotient of a height of the reflector housing and the width of the emission side may be at least 0.2 or 0.4 or 0.6. Alternatively or additionally, this quotient is at most 1.2 or 1.0 or 0.8.

An average angle of inner sides of the reflector housing relative to the emission side may be at least 35° or 50° or 60°. Alternatively or additionally, this angle is at most 85° or 65°.

The width of the emission side, viewed in cross section, may be at least 0.45 mm or 0.6 mm or 0.7 mm. Alternatively or additionally, the width of the emission side may be at most 1.1 mm or 0.8 mm or 0.6 mm. The width of the emission side is in particular an edge length or an average edge length of the semiconductor layer sequence.

The width and/or an average diameter of the radiation exit opening may be at least 0.3 mm or 0.4 mm. Alternatively or additionally, the width and/or the average diameter of the radiation exit opening may be at most 0.6 mm or 0.5 mm or 0.4 mm. In other words, the radiation exit opening is comparatively small.

The height of the reflector housing may be at least 0.1 mm or 0.2 mm or 0.3 mm. Alternatively or additionally, the height may be at most 0.7 mm or 0.55 mm or 0.3 mm.

A maximum emission of the generated radiation may lie in an emission angle range of at least 30° or 40° and/or of at most 60° or 55° or 50°. This means that a maximum intensity is emitted at comparatively large angles. The emission angle relates in particular to a perpendicular to the emission side and/or to a main side of the carrier opposite the emission side.

The semiconductor component may comprise a connection platform. The connection platform is preferably provided with electrical lines and/or electrical contact surfaces to make electrical contact. It is possible for the connection platform to be impermeable to the generated radiation. The connection platform is, for example, a ceramic substrate, for example, made of AN, a glass substrate, a semiconductor substrate such as a silicon substrate, or also a printed circuit board or a metal core board.

The mirror, the semiconductor layer sequence, the carrier and the reflector housing may be mounted on the connection platform. Viewed in plan view, in the lateral direction the connection platform preferably extends over all of the aforementioned components. Alternatively, it is possible for the reflector housing and for the connection platform to terminate flush with one another in the lateral direction.

The reflector housing may surround the semiconductor layer sequence and/or the mirror all around. That is, side surfaces of the semiconductor layer sequence and/or of the mirror can partially or completely, preferably directly, abut against the reflector housing and can be covered by the latter.

A side of the mirror facing away from the semiconductor layer sequence may terminate flush with the reflector housing. Alternatively, it is possible for the rear side of the semiconductor layer sequence to be flush with the reflector housing, or that a side of the carrier facing the emission side, that is, on the light entrance side of the carrier, terminates flush with the reflector housing.

The reflector housing may have a rectangular outer contour line when viewed in cross section. This means that the reflector housing is in particular cuboid.

The emission side and/or the radiation exit opening may be shaped in a hexagonal, square or rectangular manner as seen in plan view. In particular, it is possible for the carrier to have the shape of a square pyramid frustum.

The side of the carrier facing away from the emission side may be smooth. Alternatively or additionally, it is possible for the side faces of the carrier to be smooth. This means that the surfaces do not have any structuring, for example, to a light scattering or to an improvement of a light decoupling efficiency.

The semiconductor component may comprise a lens. The lens, in particular an extraction lens, can be located directly on the radiation exit opening and can be in direct contact with the carrier and/or with the reflector housing.

The lens may project beyond the radiation exit opening all around as viewed in plan view. This means that the entire radiation exit opening can be covered by the lens and that the lens can reach onto the reflector housing. Alternatively, it is possible that the lens is restricted to the radiation exit opening and does not or not significantly cover the reflector housing.

The lens may project all around from the reflector housing or terminates flush with the reflector housing. This means that the lens is preferably restricted to the reflector housing and does not protrude laterally beyond the reflector housing and/or the connection platform.

My optoelectronic semiconductor component is explained in more detail below with reference to the drawing on the basis of examples. Identical reference signs indicate the same elements in the individual figures. However, no relationships to scale are illustrated. Rather, individual elements can be represented with an exaggerated size to afford a better understanding.

Figure 1:
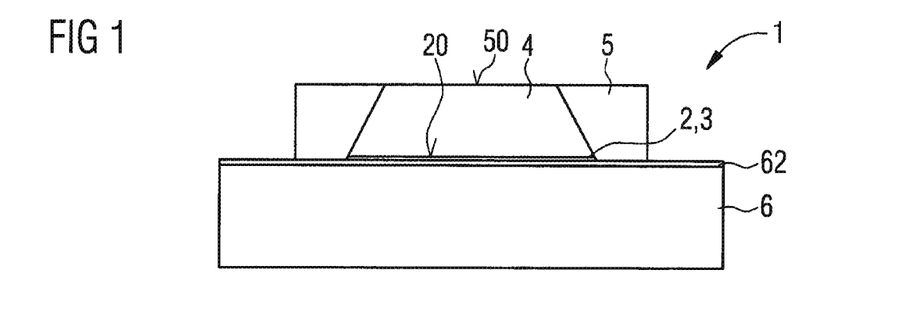
FIGS. 1, 2A and 4 to 8 show schematic sectional representations of examples of semiconductor components.

FIG. 1 shows an example of an optoelectronic semiconductor component 1. The semiconductor component 1 comprises a semiconductor layer sequence 2 having an emission side 20. For example, the semiconductor layer sequence 2 is based on AlInGaN. On the emission side 20 there is a carrier 4 which, viewed in cross section, is shaped like a symmetrical trapezoid. The carrier 4 can be a growth substrate for the semiconductor layer sequence 2, for example, a sapphire substrate. The emission side 20 and thus the side of the carrier 4 facing the semiconductor layer sequence 2 can be smooth.

On a side of the semiconductor layer sequence 2 facing away from the carrier 4, there is a mirror 3 that electrically contacts the semiconductor layer sequence 2 and reflects radiation generated in the semiconductor layer sequence during operation. Furthermore, a reflector housing 5 is provided around the carrier 4 and the semiconductor layer sequence 2. The reflector housing 5 is made of a diffusely reflecting material. The reflector housing 5 preferably appears white. For example, the reflector housing 5 is formed by a silicone matrix in which reflective particles are embedded, for instance, made of titanium dioxide. A radiation exit opening 50 of the reflector housing 5 is smaller than the emission side 20.

Optionally, the semiconductor component 1 comprises a connection platform 6. The connection platform 6 comprises a contact layer 62. The mirror 3 and the semiconductor layer sequence 2 can be electrically and/or mechanically fastened by the contact layer 62.

Figure 2A:
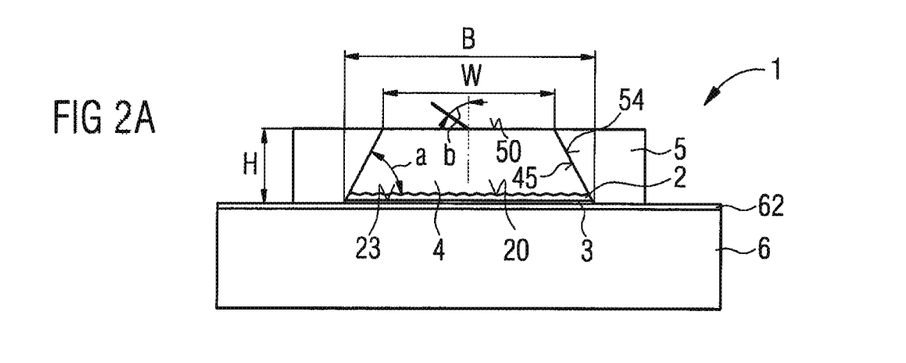

Optionally, as shown in FIG. 2A, the emission side 20 and thus the side of the carrier 4 facing the semiconductor layer sequence 2 can be provided with a roughening for improving the light coupling efficiency of light from the semiconductor layer sequence 2 into the carrier 4.

Figure 2B:
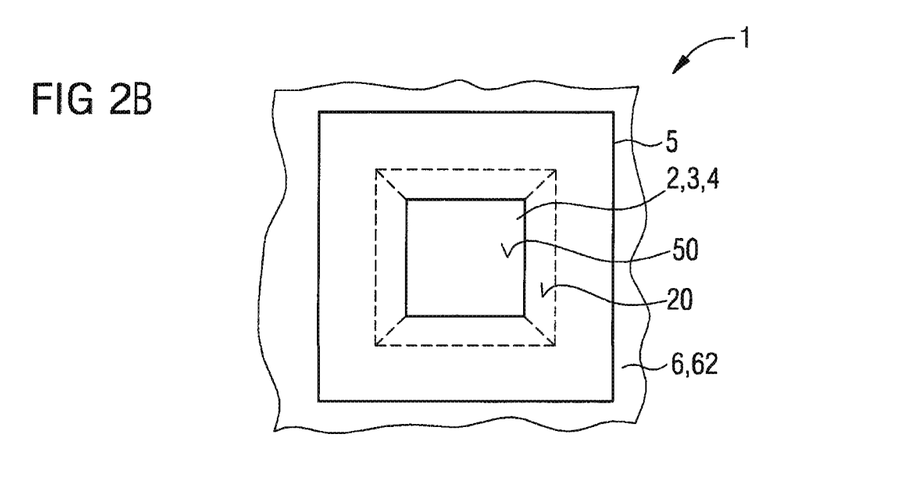
FIG. 2B shows a schematic plan view of an example of a semiconductor component.

The emission side 20 and the radiation exit opening 50 and optionally the reflector housing 5 as a whole can be of square shape, seen in plan view, compare FIG. 2B. The carrier 4 is thus formed in particular as a stub of a truncated square pyramid The optical properties and the geometry of the reflector housing 5 are explained in more detail in conjunction with FIGS. 2A and 3. As already explained in relation to FIGS. 1 and 2A, the emission side 20 has a width B which is larger than a width W of the radiation exit opening 50, when viewed in cross section. Thus, an angle a between inner sides 54 of the reflector housing 5, corresponding to the side surfaces 45 of the carrier 4, is less than 90°, in relation to the emission side 20. In particular, the angle a is approximately 60°. The width B is, for example, approximately 0.5 mm. A height H of the reflector housing 5 is approximately 150 μm, for example.

Figure 3A:
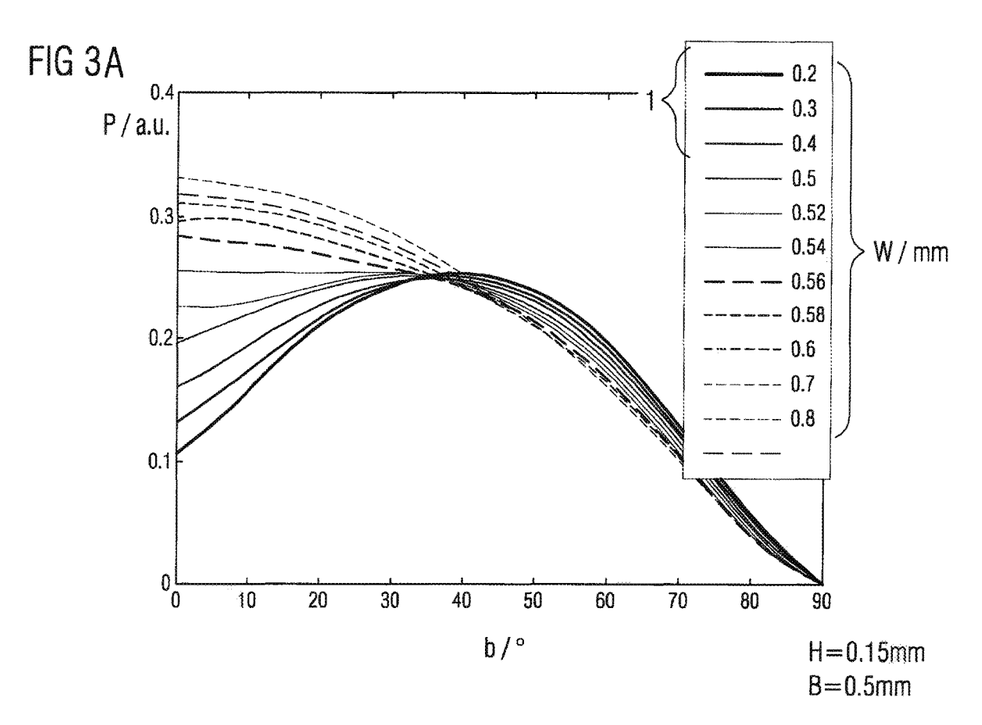
FIGS. 3A and 3B show schematic representations of optical properties of semiconductor components.

For this design of FIG. 2A, in FIG. 3A for different widths W of the radiation exit opening 50, a luminous flux P is illustrated in arbitrary units relative to an emission angle b relative to a perpendicular to the emission side 20. Three examples are illustrated in which W<B. In addition, a plurality of modifications are represented and, further, in comparison a Lambertian emission characteristic is represented as a dash line. Due to the carrier 4 which narrows in the direction away from the emission side 20 and rests directly on the reflector housing 5, a maximum emission is achieved in an angular range for the emission angle b of approximately 30° to 50°. A batwing-like emission characteristic can thus be achieved due to the reflector housing 5.

Figure 3B:
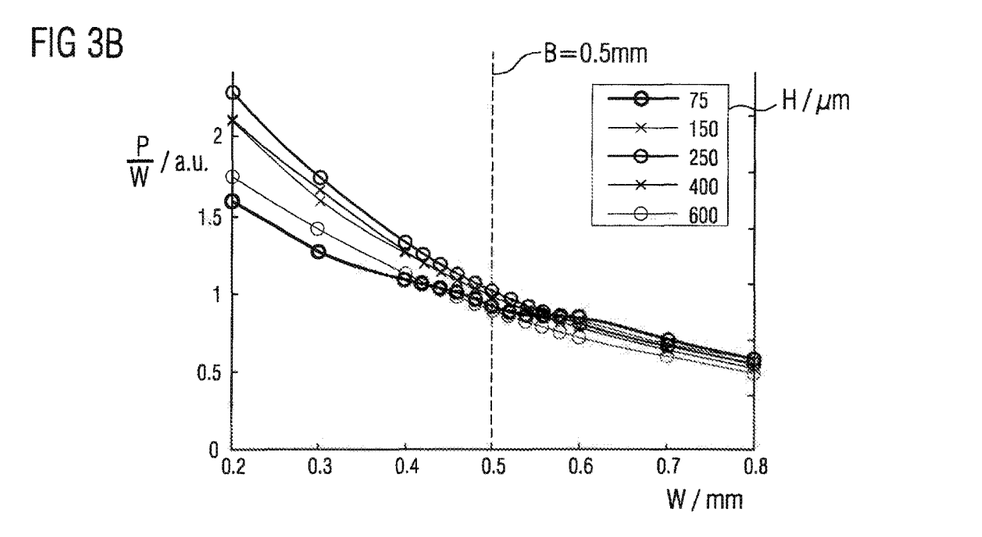

In FIG. 3B, the quotient of the luminous flux P to the width W of the radiation exit opening is illustrated, relative to the width W. The quotient P/W corresponds to a luminance and in particular to a power normalized to the radiation exit area. The curves correspond to different values for the height H of the reflector housing 5, as illustrated in conjunction with FIG. 2A, depending on the width W. From FIG. 3D, it can be seen that the luminance increases as the width W becomes smaller.

Figure 4:
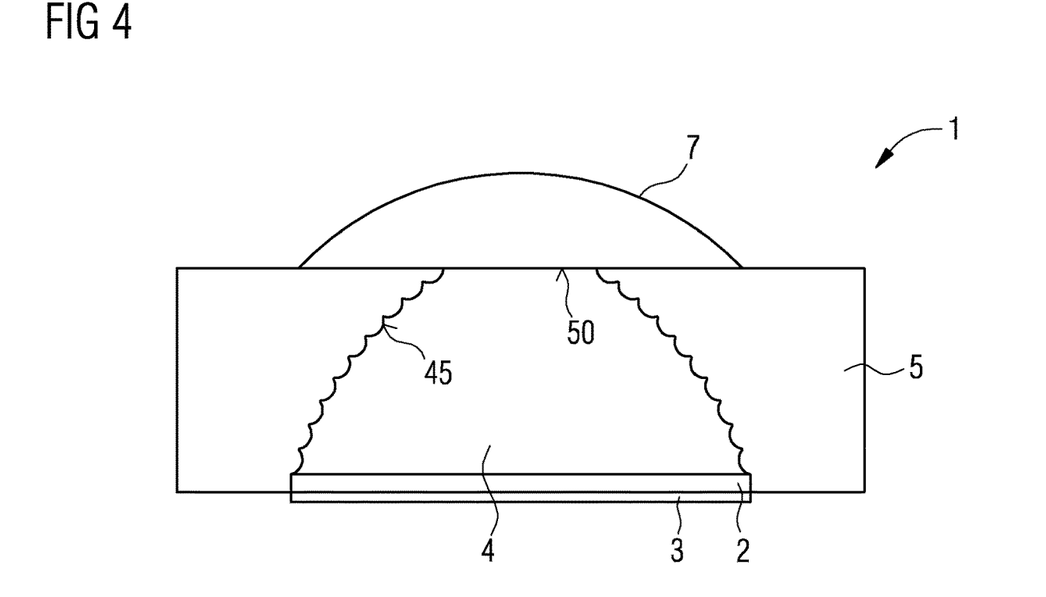

A further example is illustrated in FIG. 4. As in all other examples, it is also possible for a lens 7 to be additionally present. Furthermore, it is possible for the side surfaces 45 not to be formed as straight sections, viewed in cross section, but to have curved or even more complex shapes.

These and further aspects are illustrated in FIGS. 4 to 7. The relevant aspects can be combined with one another and can be used accordingly in the other examples.

Figure 5:
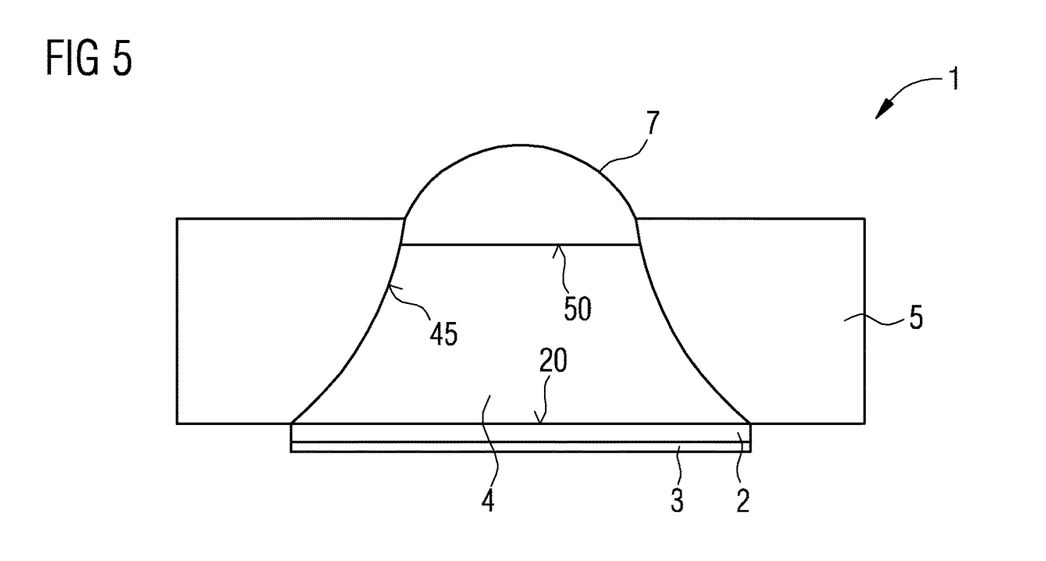

According to FIG. 4, the lens 7 completely covers the radiation exit opening 50 and also partially covers the reflector housing 5. Contrary to that, as shown in FIG. 5, the lens 7 can be restricted to the radiation exit opening 50. Alternatively, as shown in FIG. 6, the lens 7 terminates flush with the reflector housing 5.

According to FIG. 4, the side surfaces 45 are curved concavely and optionally provided with a roughening. Such a roughening of the side surfaces 45 can also be present in all other examples. Deviating therefrom, according to FIG. 5, the side surfaces 45 are shaped convexly. In FIG. 6 it can be seen that the side surfaces 45 are formed by a plurality of, in particular each by two, straight sections which merge into one another at a kink 55. The side surfaces 45 of FIG. 6 are thus approximately convex, similarly to FIG. 5. Concavely shaped side surfaces 45 can be provided in the same way as shown in FIG. 4.

Figure 6:
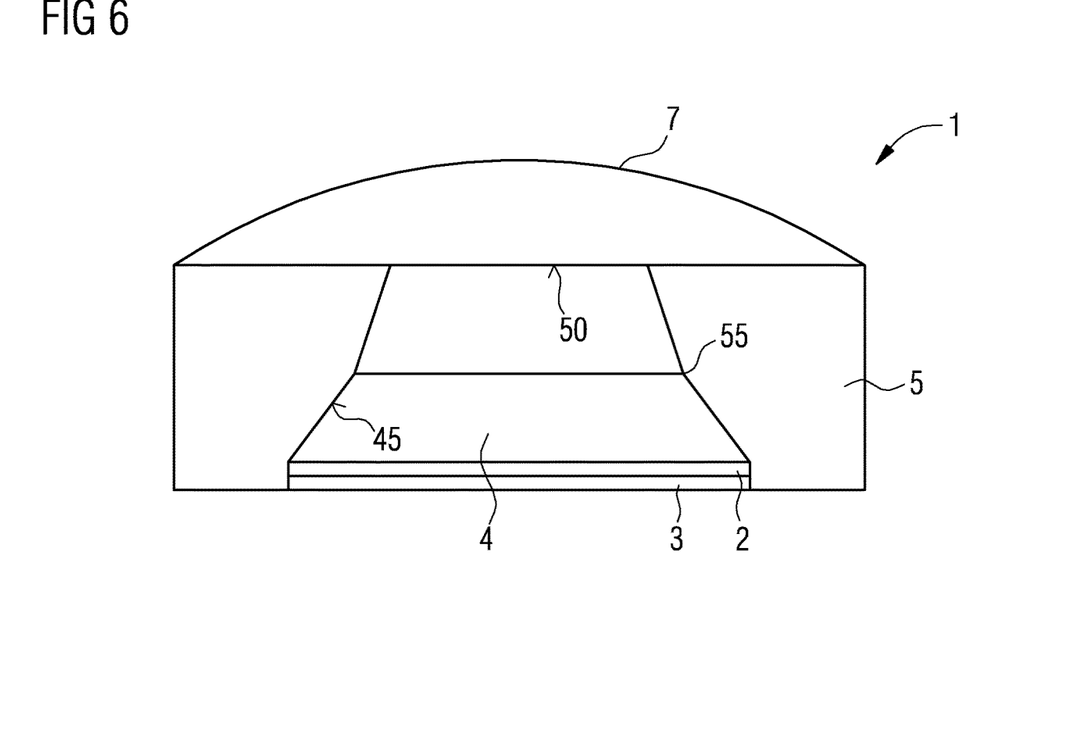
Figure 7:
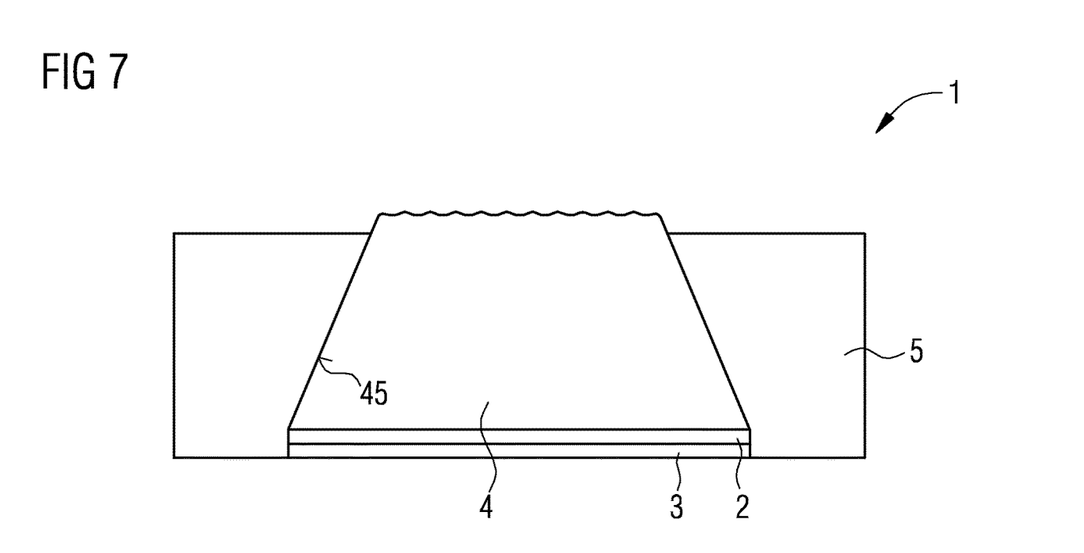

In the examples in particular of FIGS. 1, 4 and 6, the carrier 4 and the reflector housing 5 are flush with one another. Deviating therefrom, the reflector housing 5 can also project beyond the carrier 4 as shown in FIG. 5, or vice versa. As can also be the case in all other examples, a side of the carrier 4 facing away from the semiconductor layer sequence 2 can be provided with a roughening, as shown in FIG. 7. However, this side of the carrier 4 is preferably smooth, as is shown, for example, in FIG. 1.

The mirror preferably terminates flush with the reflector housing in the direction away from the semiconductor layer sequence 2, as shown in, for example, FIG. 1, 6 or 7. Alternatively, it is possible that a side of the semiconductor layer sequence 2 facing away from the carrier 4 terminates flush with the reflector housing 5, as shown in FIG. 4. Furthermore, it is possible that the carrier 4 terminates flush with the reflector housing 5 on the emission side 20, as illustrated in FIG. 5.

The mirror 3 and/or the semiconductor layer sequence 2 can taper in the direction towards the radiation exit opening 50, in the same way as the carrier 4. In the region of the mirror 3 and/or of the semiconductor layer sequence 2, the width of the opening in the reflector housing 5 can remain constant and thus do not decrease in the direction towards the radiation exit opening 50.

Figure 8:
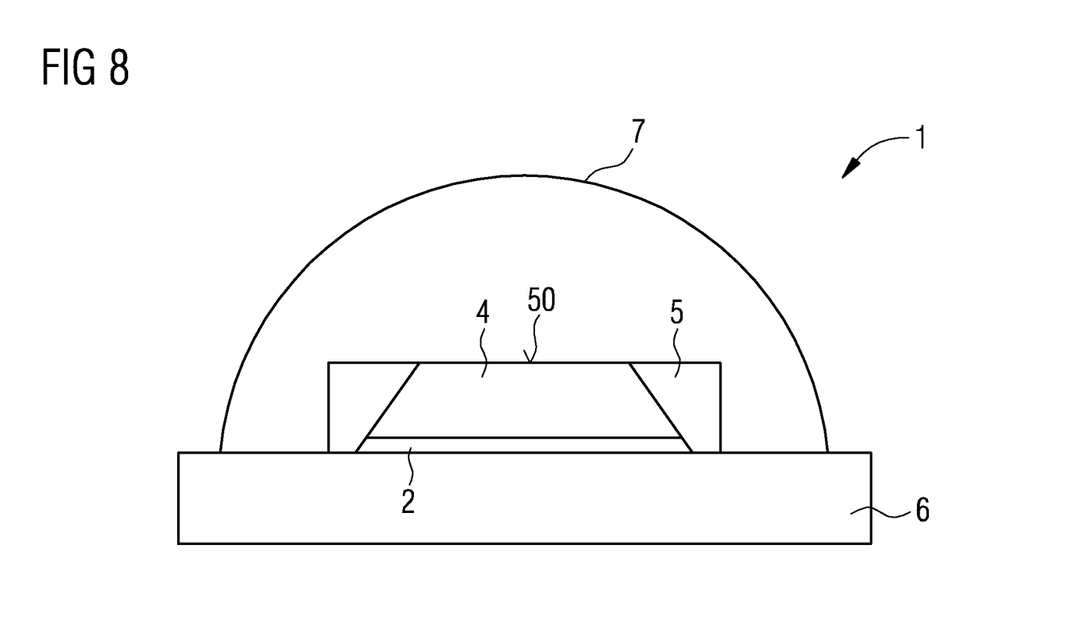

In the example of FIG. 8, the lens 7 projects laterally beyond the reflector housing 5. In this example, the lens can reach as far as the connection platform 6.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. The relative thickness ratios, length ratios and positions of the drawn components relative to one another are correctly reproduced in the figures, unless indicated otherwise.

My components are not restricted by the description on the basis of the examples. Rather, this disclosure encompasses any new feature and also any combination of features that includes in particular any combination of features in the appended claims, even if the feature or combination itself is not explicitly specified in the claims or the examples.

This application claims priority of DE 10 2017 104 871.5, the subject matter of which is incorporated herein by reference.

The invention claimed is:

1. An optoelectronic semiconductor component comprising:
    a semiconductor layer sequence that generates radiation, the semiconductor layer sequence has an emission side and a rear side opposite said emission side,
    a mirror for the generated radiation on the rear side,
    a carrier that is transmissive to the radiation generated, on the emission side, and
    a reflector housing directly on side surfaces of the carrier, the reflector housing is impermeable to the generated radiation and configured for diffuse reflection of generated radiation and comprises a radiation exit opening,
    wherein at least one of a width of an opening in the reflector housing and an area of the radiation exit opening decrease(s) in a direction away from the emission side, and
    a maximum emission of the generated radiation takes place in an emission angle range of 30° to 60°, relative to a perpendicular to the emission side.

2. The optoelectronic semiconductor component according to claim 1, wherein the side surfaces of the carrier are covered completely by the reflector housing, and the carrier is shaped as a symmetrical trapezoid when viewed in cross section.

3. The optoelectronic semiconductor component according to claim 1, wherein
    the carrier is a growth substrate of the semiconductor layer sequence,
    the carrier terminates flush with the reflector housing in the direction away from the emission side, and
    the semiconductor layer sequence is electrically contacted by the mirror.

4. The optoelectronic semiconductor component according to claim 1, wherein, when viewed in cross section, a quotient of a width (W) of the radiation exit opening and a width (B) of the emission side is 0.5 to 0.7.

5. The optoelectronic semiconductor component according to claim 4, wherein a quotient of a height (H) of the reflector housing and the width (B) of the emission side is 0.2 to 0.8.

6. The optoelectronic semiconductor component according to claim 1, wherein a mean angle (a) of inner sides of the reflector housing to the emission side is 60° to 75°.

7. The optoelectronic semiconductor component according to claim 1, wherein the maximum emission of the generated radiation takes place in the emission angle range of 40° to 55°, relative to the perpendicular to the emission side.

8. The optoelectronic semiconductor component according to claim 1, further comprising a connection platform impermeable to the generated radiation and has electrical lines that contact the semiconductor layer sequence, wherein the mirror, the semiconductor layer sequence, the carrier and the reflector housing are mounted on the connection platform.

9. The optoelectronic semiconductor component according to claim 1, wherein the reflector housing surrounds the semiconductor layer sequence and the mirror all around and terminates flush with the mirror on the rear side.

10. The optoelectronic semiconductor component according to claim 1, wherein the reflector housing, viewed in cross section, has a rectangular outer contour line.

11. The optoelectronic semiconductor component according to claim 1, wherein the reflector housing is made of a silicone provided with light-scattering titanium dioxide particles so that the reflector housing is white.

12. The optoelectronic semiconductor component according to claim 1, wherein the emission side and the radiation exit opening, as viewed in plan view, are a square shape, and the carrier has the shape of a truncated square pyramid.

13. The optoelectronic semiconductor component according to claim 1, wherein a light entry side of the carrier, facing the emission side, is provided with a structuring that improves coupling the generated radiation into the carrier, and the carrier is smooth on a side facing away from the emission side.

14. The optoelectronic semiconductor component according to claim 1, further comprising a lens mounted directly on the radiation exit opening, wherein the lens, viewed in plan view, protrudes around the radiation exit opening.

15. The optoelectronic semiconductor component according to claim 14, wherein the lens laterally projects beyond the reflector housing.

\* \* \* \* \*